(12) United States Patent
Yang et al.

(10) Patent No.: US 11,575,853 B2
(45) Date of Patent: Feb. 7, 2023

(54) IMAGE SENSOR HAVING HIGH RESOLUTION ANALOG TO DIGITAL CONVERTER

(71) Applicant: SHENZHEN GOODIX TECHNOLOGY CO., LTD., Shenzhen (CN)

(72) Inventors: Chao Yang, San Diego, CA (US); Matthew Powell, San Diego, CA (US)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 324 days.

(21) Appl. No.: 17/037,428

(22) Filed: Sep. 29, 2020

(65) Prior Publication Data
US 2022/0103768 A1 Mar. 31, 2022

(51) Int. Cl.
H04N 5/378 (2011.01)
H04N 5/374 (2011.01)
H03M 1/12 (2006.01)
H03M 1/50 (2006.01)
H03M 1/56 (2006.01)
H03K 5/134 (2014.01)
H03M 1/10 (2006.01)
H04N 5/355 (2011.01)
H04N 5/3745 (2011.01)

(52) U.S. Cl.
CPC .......... *H04N 5/378* (2013.01); *H03K 5/134* (2014.07); *H03M 1/1009* (2013.01); *H03M 1/12* (2013.01); *H03M 1/50* (2013.01); *H03M 1/56* (2013.01); *H04N 5/355* (2013.01); *H04N 5/37455* (2013.01)

(58) Field of Classification Search
CPC ........ H04N 5/355; H04N 5/378; H04N 5/369; H04N 5/37455; H04N 5/374; H03K 5/134; H03M 1/1009; H03M 1/1014; H03M 1/123; H03M 1/56; H03M 1/12; H03M 1/50
See application file for complete search history.

(56) References Cited

U.S. PATENT DOCUMENTS 9,529,336 B2 * 12/2016 Liu .................. G04F 10/005
11,444,630 B1 *  9/2022 Hsia ................. H03M 1/0617
2010/0271525 A1 * 10/2010 Takahashi ........... H04N 5/3742
                                                        341/169

(Continued)

*Primary Examiner* — Abdelaaziz Tissire
(74) *Attorney, Agent, or Firm* — Kilpatrick Townsend & Stockton LLP

(57) ABSTRACT

An image sensor includes ADCs, each including a comparator receiving a ramp signal and an image signal, and generating a comparator output. Each ADC also includes a counter ceasing to change a digital count value in response to a change in the comparator output. The digital count value has a first resolution. Each ADC also includes a delay line circuit including a delay line generating a first digital value encoding a duration of a period of the counter clock and generating a second digital value encoding a first portion of the period of the counter clock. Each ADC also includes a delay to digital circuit generating a digital output value based on the first and digital values. The digital output value encodes a second value of the ramp signal, where the digital count value has a second resolution that is greater than the first resolution.

20 Claims, 5 Drawing Sheets

(56) References Cited

U.S. PATENT DOCUMENTS

| | | | |
|---|---|---|---|
| 2011/0187907 A1* | 8/2011 | Takahashi | H04N 5/335 341/169 |
| 2011/0292265 A1* | 12/2011 | Takahashi | H04N 5/3745 348/308 |
| 2012/0229319 A1* | 9/2012 | Takahashi | H04N 5/378 341/155 |
| 2015/0181145 A1* | 6/2015 | Lee | H04N 5/3765 341/158 |
| 2021/0064367 A1* | 3/2021 | Kim | H03K 21/08 |

* cited by examiner

IMAGE SENSOR HAVING HIGH RESOLUTION ANALOG TO DIGITAL CONVERTER

TECHNICAL FIELD

The subject matter described herein relates to image sensors, and more particularly to image sensors having high resolution analog to digital converters (ADCs).

BACKGROUND

Image sensor resolution is affected by resolution of ADCs used to convert sensed data voltages to digital signals. Circuit techniques for implementing compact ADCs is needed in the art.

SUMMARY

One inventive aspect is an image sensor. The image sensor includes a plurality of image sensor cells, each configured to generate an image signal, and a plurality of analog to digital converters (ADCs), each configured to receive the image signal of one of the image sensor cells. Each ADC includes a comparator configured to receive a ramp signal and the image signal of one of the image sensor cells, and to generate a comparator output signal indicating whether the ramp signal is greater than the image signal. Each ADC also includes a counter configured to change a digital count value in response to a counter clock signal, and configured to cease changing the digital count value in response to a change in the comparator output signal, where the digital count value encodes a first analog value of the ramp signal, and where the digital count value has a first resolution. Each ADC also includes a delay line circuit including one or more delay lines, where the delay line circuit is configured to generate a first digital value encoding a duration of a period of the counter clock signal and to generate a second digital value encoding a first portion of the period of the counter clock signal. Each ADC also includes a delay to digital circuit configured to generate a digital output value based on the first digital value and the second digital value, where the digital output value encodes a second value of the ramp signal, where the digital count value has a second resolution, and where the second resolution is greater than the first resolution.

In some embodiments, the delay line circuit includes a single delay line, where the single delay line is used to generate both the first digital value and the second digital value.

In some embodiments, the delay to digital circuit is configured to determine a third digital value encoding a second portion of the period of the counter clock signal, where a sum of a duration of the second portion of the period of the counter clock signal and a duration of the first portion of the period of the counter clock signal is equal to a duration of the period of the counter clock signal, and where the delay to digital circuit is configured to generate the digital output value based on the first digital value and the third digital value.

In some embodiments, the delay line circuit includes a single delay line, where the single delay line is used to generate results for both the first digital value and the third digital value.

In some embodiments, the delay to digital circuit is configured to store the first digital value and the second digital value, and to generate the third digital value based on the first digital value and the second digital value.

In some embodiments, the delay to digital circuit is configured to generate the digital output value by successively subtracting a particular value from the third digital value.

In some embodiments, the particular value is the first digital value divided by 2n, where n=a number of bits of the second resolution.

In some embodiments, the digital output value is determined based on the a number of subtraction operations required to generate a result having a value less than or equal to zero.

In some embodiments, the delay to digital circuit includes an arithmetic circuit configured to successively subtract the particular value from the third digital value by successively subtracting the particular value from a result of a previous subtraction operation.

In some embodiments, the digital output value corresponds with a ratio of a first time duration to a second time duration, where the first time duration starts with a first edge of the counter clock signal and ends with the comparator output signal changing states, and the second time duration is equal to the duration of the period of the counter clock signal.

Another inventive aspect is a method of using an image sensor. The method includes, with each of a plurality of image sensor cells, generating an image signal, with each of a plurality of analog to digital converters (ADCs), receiving the image signal of one of the image sensor cells, with a comparator of a particular ADC, receiving a ramp signal and the image signal of one of the image sensor cells, with the comparator, generating a comparator output signal indicating whether the ramp signal is greater than the image signal, and with a counter of the particular ADC, changing a digital count value in response to a counter clock signal, where the digital count value encodes a first analog value of the ramp signal, and where the digital count value has a first resolution. The method also includes, with the counter, in response to a change in the comparator output signal, ceasing to change the digital count value, with a delay line circuit of the particular ADC, generating a first digital value encoding a duration of a period of the counter clock signal, with the delay line circuit, generating a second digital value encoding a first portion of the period of the counter clock signal, and, with a delay to digital circuit of the particular ADC, generating a digital output value based on the first digital value and the second digital value, where the digital output value encodes a second analog value of the ramp signal, where the digital count value has a second resolution, and where the second resolution is greater than the first resolution.

In some embodiments, the delay line circuit includes a single delay line, where the single delay line is used to generate both the first digital value and the second digital value.

In some embodiments, the method also includes, with the delay to digital circuit, determining a third digital value encoding a second portion of the period of the counter clock signal, where a sum of a duration of the second portion of the period of the counter clock signal and a duration of the first portion of the period of the counter clock signal is equal to a duration of the period of the counter clock signal, and, with delay to digital circuit, generating the digital output value based on the first digital value and the third digital value.

In some embodiments, the delay line circuit includes a single delay line, where the single delay line is used to generate results for both the first digital value and the third digital value.

In some embodiments, the method also includes, with the delay to digital circuit, storing the first digital value and the second digital value, and, with the delay to digital circuit, generating the third digital value based on the first digital value and the second digital value.

In some embodiments, the method also includes, with the delay to digital circuit, generating the digital output value by successively subtracting a particular value from the third digital value.

In some embodiments, the particular value is the first digital value divided by 2n, where n=a number of bits of the second resolution.

In some embodiments, the digital output value is determined based on the a number of subtraction operations required to generate a result having a value less than or equal to zero.

In some embodiments, the delay to digital circuit includes an arithmetic circuit, and the method further includes, with the arithmetic circuit, successively subtracting the particular value from the third digital value by successively subtracting the particular value from a result of a previous subtraction operation.

In some embodiments, the digital output value corresponds with a ratio of a first time duration to a second time duration, where the first time duration starts with a first edge of the counter clock signal and ends with the comparator output signal changing states, and the second time duration is equal to the duration of the period of the counter clock signal.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations.

When practical, similar reference numbers denote similar structures, features, or elements.

DETAILED DESCRIPTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

Figure 1:
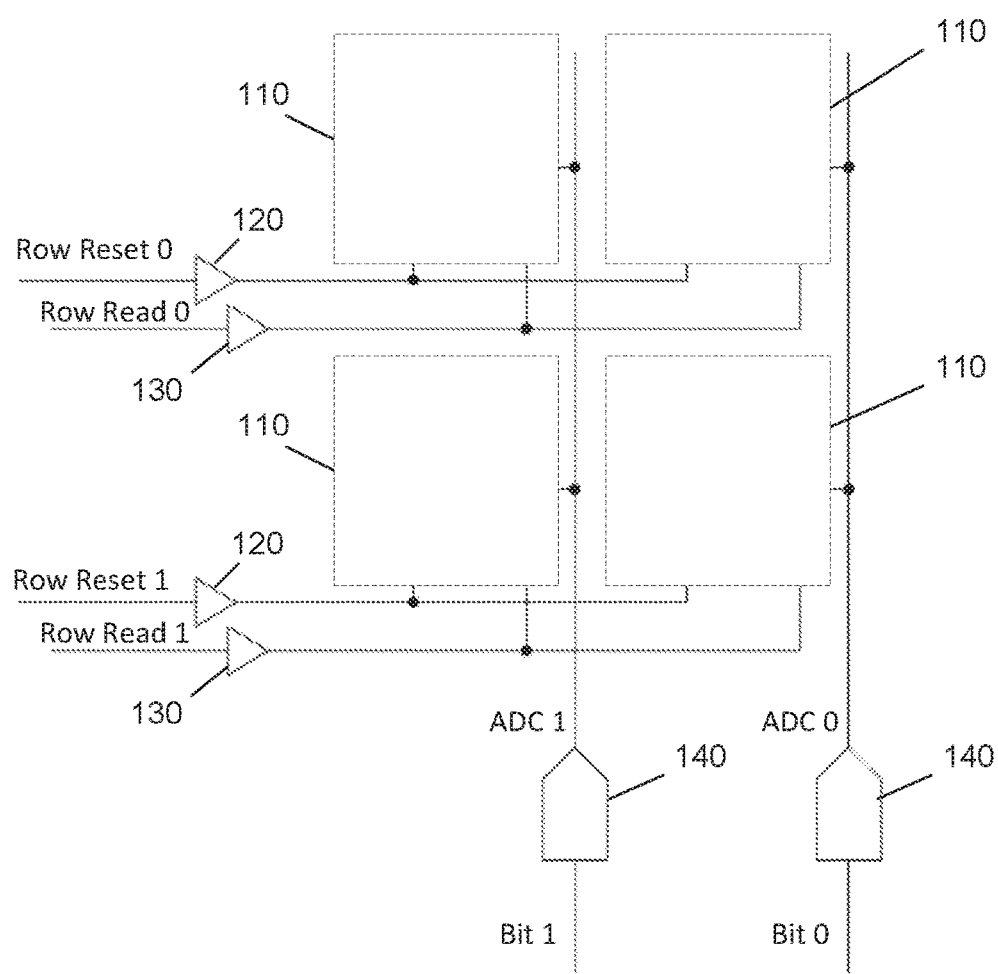
FIG. 1 is a schematic diagram of an embodiment of an image sensor array.

Circuit features of image sensor circuits providing high resolution image read data with compact implementations are described herein with reference to certain embodiments. Some of the features are illustrated in the figures. For example, the figures illustrate circuits which perform a time to digital conversion which can be used to extend resolution of a ramp ADC. The circuits use a delay line to measure a duration of time corresponding to an unresolved portion of the input voltage. The circuits also use a delay line to measure a period of the ramp voltage counter clock. Because the circuits measure the period with a delay line, the delay line does not need to be supported by large circuits used to precisely calibrate the delay line. FIG. 1 is a schematic diagram of an embodiment of an image sensor array. FIGS. 2-6 illustrate a ramp ADC circuit, which may be compact, and its operation. FIG. 7 is a schematic illustration of a calibration circuit and delay line.

FIG. 1 is a schematic diagram of an embodiment of an image sensor array 100. Image sensor array 100 includes four image sensor cells 110, row reset buffers 120, row read buffers 130, and ADCs 140. Image sensor array 100 is an example only. Image sensor arrays having different features may alternatively be used.

Each of the image sensor cells 110 includes a photodiode, one or more switches configured to selectively receive signals from the row reset and row read buffers connected thereto. In response to the received signals, the switches cooperatively cause each of the image sensor cells 110 to accumulate charge with a storage capacitance according to an amount of light incident thereon, to deliver an image data signal to the one of the ADCs 140 based on the accumulated charge, to initialize the input of one of the ADCs 140, and to initialize the charge storage capacitance.

The ADCs 140 are configured to generate digital words corresponding with the analog voltage at their respective input nodes. Accordingly, the digital words generated by the ADCs correspond with and are a digital representation of the charge accumulated by the image sensor cells 110.

The charge stored in the image sensor cells 110 is a result of accumulated charge conducted by the respective photodiodes, as understood by those of skill in the art, between a time when the charge storage capacitance of image sensor cells 110 are initialized and a time when the image data signal is received by one of the ADCs 140.

The rows of image sensor cells 110 are successively read, and the digital words generated by the ADCs 140 are successively stored in a memory (not shown) to generate image data representing an image sensed by the entire sensor array 100, as understood by those of skill in the art. Furthermore, image data representing multiple images may be successively sensed by the sensor array 100, and stored in the memory.

Figure 2:
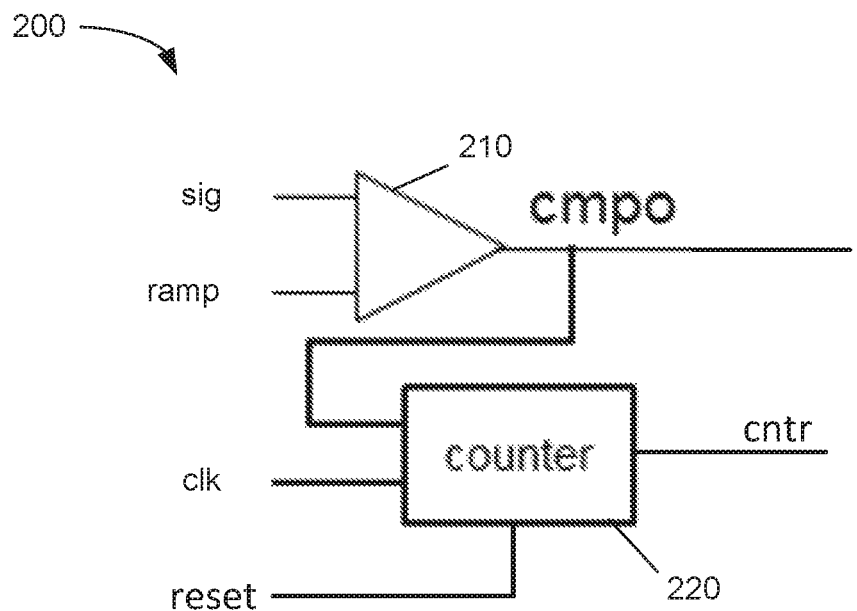
FIG. 2 is a schematic diagram of an embodiment of a ramp ADC circuit, which may be used in the ADC of the sensor array of FIG. 1.

FIG. 2 is a schematic diagram of an embodiment of a ramp ADC circuit 200, which may be used in the ADC of the sensor array of FIG. 1. Ramp ADC circuit 200 includes comparator 210, and counter 220. Other ADC topologies may be used, as understood by those of skill in the art.

Figure 3:
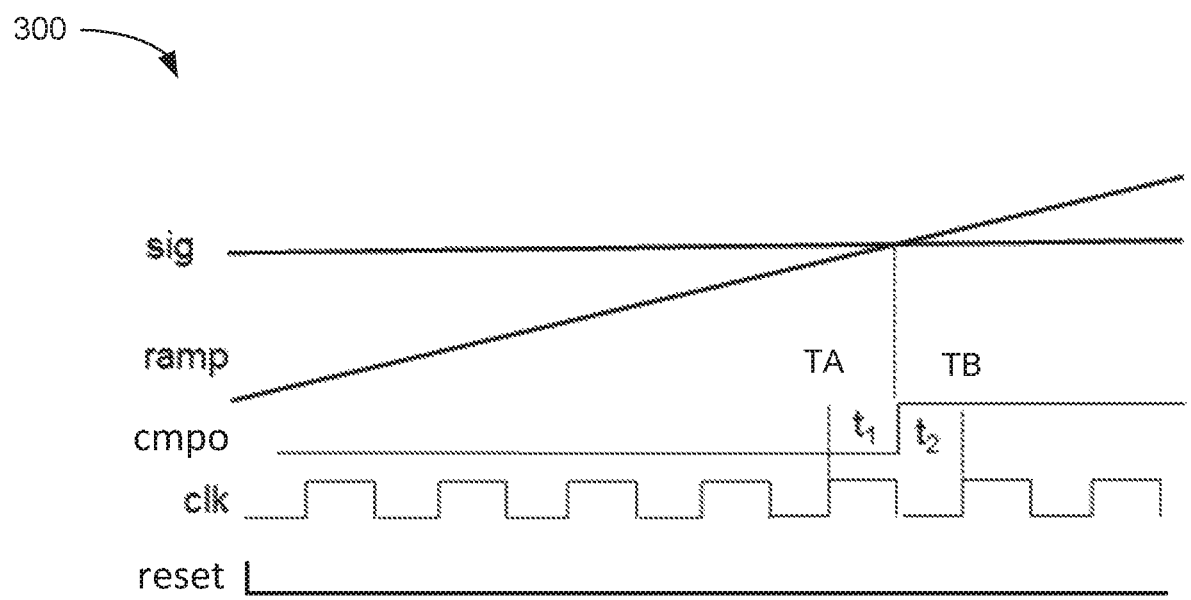
FIG. 3 is a timing diagram illustrating functionality of the ramp ADC circuit of FIG. 2.

FIG. 3 is a timing diagram 300 illustrating functionality of the ramp ADC circuit 200 of FIG. 2.

Comparator 210 receives an analog input voltage equal to or otherwise based on an ADC input voltage at its input node sig. Comparator 210 also receives a changing ramp signal at its input node ramp. The ramp voltage is generated by a ramp voltage generator circuit (not shown) known to those of skill in the art, and is configured to generate the ramp voltage having a slope (dv/dt), average slope, or voltage increase per clock signal period of the clock for counter 220.

Counter 220 receives a reset signal configured to reset the counter to a known state, such as count value zero. Counter 220 also receives a clock signal at its input clk, and a stop count signal from the output cmpo from comparator 210.

In response to the reset signal going low, counter is enabled, and thereafter increments its stored count value in response to each rising edge of the clock signal clk. In addition, the ramp voltage generator circuit begins increasing the voltage from a reset value at input node ramp of comparator 210.

After a number of rising edges of the clock signal clk, the voltage of the ramp signal at comparator 210 input node ramp becomes greater than the analog input voltage at input node sig. In response to the voltage of the ramp signal being greater than the analog input voltage, the comparator output at node cmpo changes states. In response to the changed state of node cmpo, counter 220 stops counting despite receiving additional rising edges of the clock signal clk.

As understood by those of skill in the art, because the slope (dv/dt), average slope, or voltage increase per clock signal period of the clock for counter 220 ramp signal is known, the count value stored by counter 220 corresponds with the voltage of the input voltage.

In the example illustrated in FIG. 3, the ramp signal becomes greater than the analog input voltage at a time occurring after the rising edge of the clock signal occurring at time TA by an amount t1 and before the rising edge of the clock signal occurring at time TB by an amount t2. Accordingly, the counter 220 stops counting after the rising edge of the clock occurring at time TA, where the count value of the counter 220 corresponds with the ramp voltage occurring at time TA. Therefore, the count value is a digital representation of the difference between the analog input voltage and the ramp reset voltage having a resolution corresponding with the ramp signal slope.

As understood by those of skill in the art, the ratio t1/(t1+t2) times the slope of the ramp signal corresponds with the actual value of the analog input voltage. In order to extend the resolution of the ramp ADC 200, a time to digital converter may be used to convert the ratio t1/(t1+t2) times the slope of the ramp signal to a digital value which can be added to the value determined by the counter 220.

Figure 4:
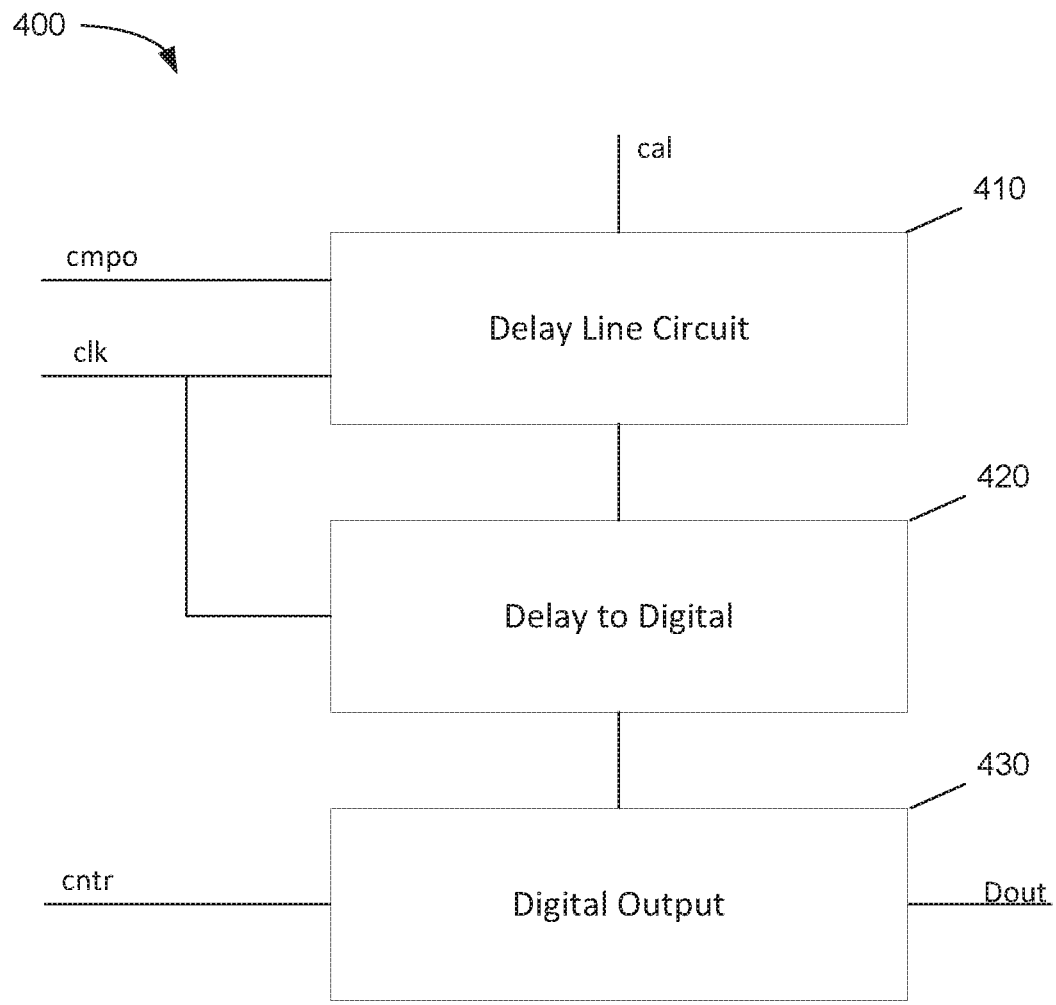
FIG. 4 is a schematic diagram of an embodiment of a time to digital converter circuit.

FIG. 4 is a schematic diagram of an embodiment of a time to digital converter circuit 400 which may be used to extend the resolution of ramp ADC circuit 200 of FIG. 2.

Time to digital converter circuit 400 includes delay line circuit 410, delay to digital circuit 420, and digital output circuit 430.

Delay line circuit 410 comprises one or more delay lines, and is configured to receive the output of comparator 210 at node cmpo and to receive the clock signal at input node clk. Each delay line has a number of delay units equal to or greater than 2n, where n represents the number of bits of resolution of the time to digital converter.

The delay lines of delay line circuit 410 are configured to generate a set of delayed versions of the clock signal received at input node clk. Delay line circuit 410 is also configured to convert the set of delayed versions of the clock signal to a first digital value representing the period of the clock signal and corresponding with time duration t1 plus time duration t2.

With reference to the example of FIG. 3, if time to digital converter 400 has 2 bits of resolution, and the delay line(s) have 6 delay units, the first digital value may be 110 (6) corresponding with the delay of 5 delay units between the rising edge of the clock signal at time TA and the rising edge of the clock signal at time TB.

In some embodiments, the one or more delay lines of delay line circuit 410 may be controlled to have a total delay based on a signal at input cal, where the signal at input cal is generated by a calibration circuit, using techniques and principles understood by those of skill in the art.

The delay lines of delay line circuit 410 are configured to generate a set of delayed versions of the comparator output signal received at node cmpo during the time between time TA and time TB. Delay line circuit 410 is also configured to convert the set of delayed versions of the comparator output signal generated at time TB to a second digital value representing the time duration t2.

With reference to the example of FIG. 3, if time to digital converter 400 has 2 bits of resolution, and the delay line(s) have 5 delay units, the second digital value may be 011 (3) corresponding with the delay of two delay units between the transition in the comparator output signal at node cmpo and the rising edge of the clock signal at time TB.

Delay to digital circuit 420 is configured to receive the first digital value, corresponding with time duration t1 plus time duration t2, and to receive second digital value, corresponding time duration t2. Delay to digital circuit 420 is also configured to generate a digital output value corresponding with the ratio $t1/(t1+t2)=((t1+t2)-t2)/(t1+t2)$.

In some embodiments, the delay to digital circuit 420 is implemented including a number of comparators each configured to compare the second digital value with the first digital value multiplied by one of a number of fractions corresponding with the number of bits of resolution of the time to digital converter 400.

For example, if time to digital converter 400 has 2 bits of resolution, the first digital value is 110, and the second digital value is 011, the second digital value 011 may be compared with the first digital value 110 multiplied by each of ¼, 2/4, and ¾.

The delay to digital circuit 420 may further include a digital circuit configured to generate the digital output value corresponding with the ratio t1/(t1+t2) based on the comparator outputs. For example, if the comparators indicate that the second digital value is greater than the first digital value multiplied by ¾, the digital circuit may output 11. Otherwise, if the comparators indicate that the second digital value is greater than the first digital value multiplied by 2/4, the digital circuit may output 10. Otherwise, if the comparators indicate that the second digital value is greater than the first digital value multiplied by ¼, the digital circuit may output 01. Otherwise, the digital circuit may output 00.

The digital output circuit 430 is configured to receive the count value of counter 220 at input bus cntr. In addition, digital output circuit 430 is configured to receive the digital output value generated by delay to digital circuit 420. The digital output circuit 430 is further configured to generate an ADC output value by combining the count value of counter 220 with the digital output value generated by delay to digital circuit 420, using techniques understood by those of skill in the art. For example, digital output circuit 430 may have a buffer for each bit of the count value and for each bit of the digital output value generated by delay to digital circuit 420. In some embodiments, digital output circuit 430 may have a wire for each bit of the count value and for each bit of the digital output value generated by delay to digital circuit 420.

Figure 5:
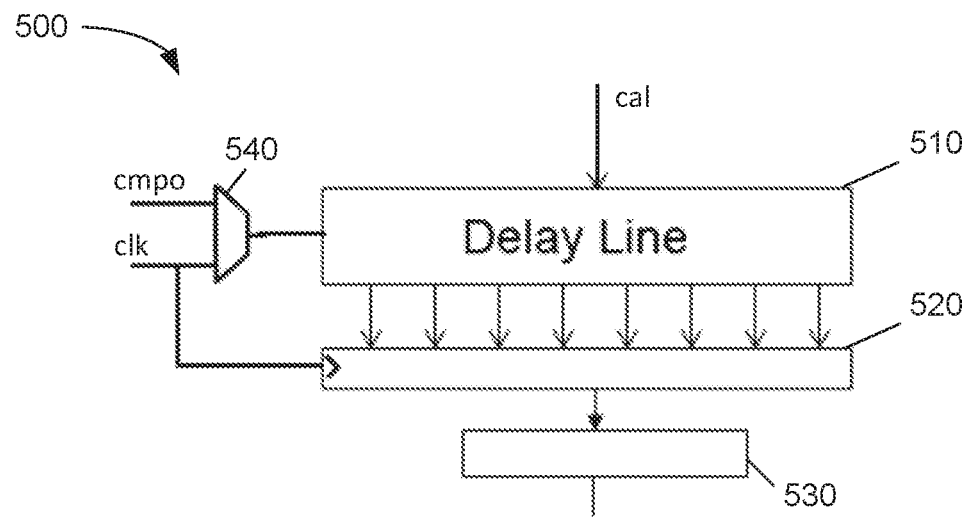
FIG. 5 is a schematic illustration of a delay line circuit which may be used in the time to digital converter circuit of FIG. 4.

FIG. 5 is a schematic illustration of a delay line circuit 500 which may be used as delay line circuit 410 of the time to digital converter circuit 400 of FIG. 4.

Delay line circuit 500 includes multiplexor 540, delay line 510, register 520, and converter circuit 530.

During a first time period starting with a first rising edge of the clock signal at node clk and ending with a second, next, rising edge of the clock signal at node clk, multiplexor 540 receives a signal causing delay line 510 to receive the clock signal at node clk as its input.

Delay line circuit 510 comprises a number of delay units equal to or greater than 2n, where n represents the number of bits of resolution of the time to digital converter. During the first time period, delay line circuit 510 is configured to generate a set of delayed versions of the clock signal received at input node clk.

In addition, at the end of the first time period, in response to the second rising edge of the clock signal at node clk, register 520 latches the state of the delay line 510, storing the output states of the delay units of delay line circuit 510. The stored output states encode the number of delay units having a total delay time corresponding with one period of the clock signal. Register 520 also provides digital data representing the output states of the delay units of delay line circuit 510 to converter circuit 530.

Converter circuit 530 is configured to generate a first digital output value encoding the digital data received from register 520 in a standard digital format. Therefore, the first digital output value generated by converter circuit 530 encodes the number of delay units having a total delay time corresponding with one period of the clock signal.

With reference to the example of FIG. 3, if time to digital converter 500 has 2 bits of resolution, and the delay line circuit 510 has 6 delay units, the first digital value may be 110 (6) corresponding with the delay of 5 delay units between the first and second rising edges of the clock signal. Accordingly, the first digital output value represents time duration t1 plus time duration t2.

In some embodiments, the one or more delay lines of delay line circuit 410 may be controlled to have a total delay based on a signal at input cal, where the signal at input cal is generated by a calibration circuit, using techniques and principles understood by those of skill in the art.

Before or after the first time period, multiplexor 540 receives a signal causing delay line 510 to receive the output of the comparator at node cmpo as its input.

During a second time period, the delay line circuit 510 is configured to generate a set of delayed versions of the comparator output signal received at node cmpo during the time between time TA and time TB.

In addition, at the end of the second time period, in response to the rising edge of the clock signal at time TB, register 520 latches the state of the delay line 510, storing the output states of the delay units of delay line circuit 510. The stored output states encode the number of delay units having a total delay time corresponding with the time duration t2. Register 520 also provides digital data representing the output states of the delay units of delay line circuit 510 to converter circuit 530.

Converter circuit 530 is configured to generate a second digital output value encoding the digital data received from register 520 in a standard digital format. Therefore, the second digital output value generated by converter circuit 530 encodes the number of delay units having a total delay time corresponding with time duration t2.

With reference to the example of FIG. 3, if the time to digital converter has 2 bits of resolution, and the delay line circuit 510 has 6 delay units, the second digital output value may be 011 (3) corresponding with the delay of two delay units between the transition in the comparator output signal at node cmpo and the rising edge of the clock signal at time TB. Accordingly, the second digital output value corresponds with time period t2.

Figure 6:
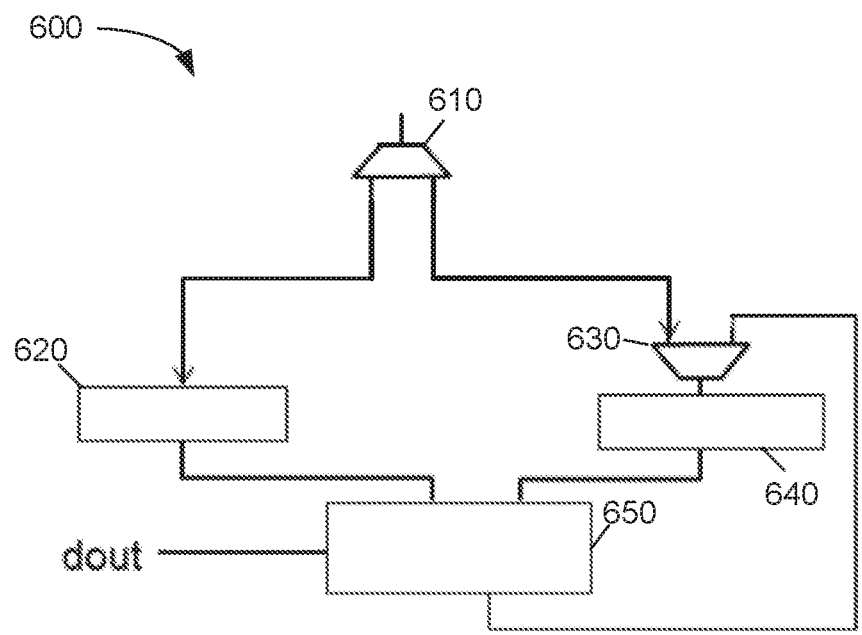
FIG. 6 is a schematic illustration of a Delay to Digital circuit which may be used in the time to digital converter circuit of FIG. 4.
Figure 7:
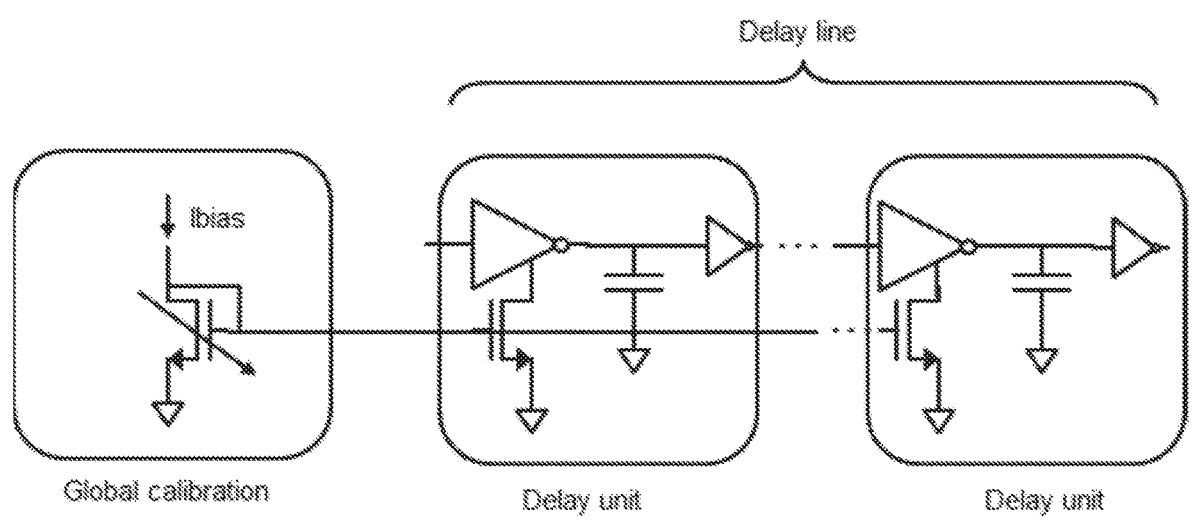
FIG. 7 is a schematic illustration of a calibration circuit and delay line which may be used in the time to digital converter circuit of FIG. 4.

FIG. 6 is a schematic illustration of a delay to digital circuit 600 which may be used as delay to digital circuit 420 in the time to digital converter circuit 400 of FIG. 4. Delay to digital circuit 600 includes multiplexor 610, register 620, multiplexor 630, register 640, and arithmetic circuit 650.

Delay to digital circuit 600 is configured to receive the first digital output value while multiplexor circuit 610 receives a control signal causing the first digital output value to be transmitted to register 620. Register 620 receives the first digital output value, and stores the first digital output value. Accordingly, register 620 stores the digital value corresponding with the duration of one period of the clock signal.

Delay to digital circuit 600 is also configured to receive the second digital output value while multiplexor circuits 610 and 630 receive respective control signals which causing the second digital output value to be transmitted to register 640. Register 640 receives the second digital output value, and stores the second digital output value. Accordingly, register 640 stores the digital value corresponding with duration of time period t2.

After register 620 stores the digital value corresponding with the duration of one period of the clock signal (t1+t2), and register 640 stores the digital value corresponding with duration of time period t2, arithmetic circuit 650 is configured to generate a digital output value corresponding with the ratio t1/(t1+t2) based on the digital value stored in registers 620 and 640.

Any circuit configured to generate the digital output value corresponding with the ratio t1/(t1+t2) based on the digital value stored in registers 620 and 640 may be used.

In some embodiments, arithmetic circuit 650 calculates and stores a value of t1, where t1=the digital value stored in register 620 (t1+t2) minus the digital value stored in register 640 (t2).

In some embodiments, arithmetic circuit 650 then determines the digital output value corresponding with the ratio t1/(t1+t2) by successively subtracting a value from the stored value of t1, where the subtracted value is equal to the digital value stored in register 620 (t1+t2) divided by 2n, where n=the number of bits of resolution of the time to digital converter. The number of subtraction operations required to generate a result having a value less than or equal to zero indicates the digital output value corresponding with the ratio t1/(t1+t2).

For example, if the time to digital converter will has 2 bits of resolution, the value of (t1+t2) is 110, and the value of t1 is 011, the value 110 divided by 4 is successively subtracted form the value 011 until the result is less than or equal to zero. In this example, the result of the first subtraction operation is 011−110/4=001.1, which is greater than zero. In addition, the result of the second subtraction operation is 001.1−110/4=0. Therefore, because the result of the second subtraction operation is equal to or less than zero, the digital output value corresponding with the ratio t1/(t1+t2) is 01, one less than the number of subtraction operations. In other examples, because the result of a third subtraction operation is less than or equal to zero, the digital output value would be 10, one less than the number of subtraction operations.

In the embodiment of FIG. 6, the successive subtraction operations are performed by arithmetic circuit 650, which may be configured to store the results of each successive subtraction operation in register 640 through multiplexer 630.

Arithmetic circuit 650 then successively subtracts the value stored in register 620 (t1+t2) divided by 2n from the value stored in register 640, stores the results in register 640, and compares the results with zero until a result is less than or equal to zero. As discussed above, arithmetic circuit 650 also counts the number of subtraction operations, and generates the digital output value based on the number of subtraction operation required to generate a result which is less than or equal to zero.

FIG. 7 is a schematic illustration of a calibration circuit and delay line which may be used in the time to digital converter circuits discussed herein. A bias current Ibias which varies with process, voltage, and temperature, as understood by those of skill in the art, is generated. For example a ring oscillator may output a frequency corresponding with process, voltage, and temperature, as understood by those of skill in the art, and a frequency to current circuit known to those of skill in the art may be used to generate the bias current. As indicated in FIG. 7, each delay unit comprises a current starved inverter whose current is generated based on the bias current.

In some embodiments, the delay lines of all of the ADCs of the image sensor are globally calibrated using the same bias current Ibias.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. An image sensor, comprising:
   a plurality of image sensor cells, each configured to generate an image signal; and
   a plurality of analog to digital converters (ADCs), each configured to receive the image signal of one of the image sensor cells, wherein each ADC comprises:
   a comparator configured to receive a ramp signal and the image signal of one of the image sensor cells, and to generate a comparator output signal indicating whether the ramp signal is greater than the image signal,
   a counter configured to change a digital count value in response to a counter clock signal, and configured to cease changing the digital count value in response to a change in the comparator output signal, wherein the digital count value encodes a first analog value of the ramp signal, and wherein the digital count value has a first resolution,
   a delay line circuit comprising one or more delay lines, wherein the delay line circuit is configured to generate a first digital value encoding a duration of a period of the counter clock signal and to generate a second digital value encoding a first portion of the period of the counter clock signal, and
   a delay to digital circuit configured to generate a digital output value based on the first digital value and the second digital value, wherein the digital output value encodes a second value of the ramp signal, wherein the digital count value has a second resolution, and wherein the second resolution is greater than the first resolution.

2. The image sensor of claim 1, wherein the delay line circuit comprises a single delay line, wherein the single delay line is used to generate both the first digital value and the second digital value.

3. The image sensor of claim 1, wherein the delay to digital circuit is configured to determine a third digital value encoding a second portion of the period of the counter clock signal, wherein a sum of a duration of the second portion of the period of the counter clock signal and a duration of the first portion of the period of the counter clock signal is equal to a duration of the period of the counter clock signal, and wherein the delay to digital circuit is configured to generate the digital output value based on the first digital value and the third digital value.

4. The image sensor of claim 3, wherein the delay line circuit comprises a single delay line, wherein the single delay line is used to generate results for both the first digital value and the third digital value.

5. The image sensor of claim 3, wherein the delay to digital circuit is configured to store the first digital value and the second digital value, and to generate the third digital value based on the first digital value and the second digital value.

6. The image sensor of claim 3, wherein the delay to digital circuit is configured to generate the digital output value by successively subtracting a particular value from the third digital value.

7. The image sensor of claim 6, wherein the particular value is the first digital value divided by $2^n$, where n=a number of bits of the second resolution.

8. The image sensor of claim 6, wherein the digital output value is determined based on the a number of subtraction operations required to generate a result having a value less than or equal to zero.

9. The image sensor of claim 6, wherein the delay to digital circuit comprises an arithmetic circuit configured to successively subtract the particular value from the third digital value by successively subtracting the particular value from a result of a previous subtraction operation.

10. The image sensor of claim 3, wherein the digital output value corresponds with a ratio of a first time duration to a second time duration, wherein the first time duration starts with a first edge of the counter clock signal and ends with the comparator output signal changing states, and the second time duration is equal to the duration of the period of the counter clock signal.

11. A method of using an image sensor, the method comprising:
with each of a plurality of image sensor cells, generating an image signal;
with each of a plurality of analog to digital converters (ADCs), receiving the image signal of one of the image sensor cells;
with a comparator of a particular ADC, receiving a ramp signal and the image signal of one of the image sensor cells;
with the comparator, generating a comparator output signal indicating whether the ramp signal is greater than the image signal;
with a counter of the particular ADC, changing a digital count value in response to a counter clock signal, wherein the digital count value encodes a first analog value of the ramp signal, and wherein the digital count value has a first resolution;
with the counter, in response to a change in the comparator output signal, ceasing to change the digital count value;
with a delay line circuit of the particular ADC, generating a first digital value encoding a duration of a period of the counter clock signal;
with the delay line circuit, generating a second digital value encoding a first portion of the period of the counter clock signal; and
with a delay to digital circuit of the particular ADC, generating a digital output value based on the first digital value and the second digital value, wherein the digital output value encodes a second analog value of the ramp signal, wherein the digital count value has a second resolution, and wherein the second resolution is greater than the first resolution.

12. The method of claim 11, wherein the delay line circuit comprises a single delay line, wherein the single delay line is used to generate both the first digital value and the second digital value.

13. The method of claim 11, further comprising:
with the delay to digital circuit, determining a third digital value encoding a second portion of the period of the counter clock signal, wherein a sum of a duration of the second portion of the period of the counter clock signal and a duration of the first portion of the period of the counter clock signal is equal to a duration of the period of the counter clock signal; and
with delay to digital circuit, generating the digital output value based on the first digital value and the third digital value.

14. The method of claim 13, wherein the delay line circuit comprises a single delay line, wherein the single delay line is used to generate results for both the first digital value and the third digital value.

15. The method of claim 13, further comprising:
with the delay to digital circuit, storing the first digital value and the second digital value; and
with the delay to digital circuit, generating the third digital value based on the first digital value and the second digital value.

16. The method of claim 13, further comprising, with the delay to digital circuit, generating the digital output value by successively subtracting a particular value from the third digital value.

17. The method of claim 16, wherein the particular value is the first digital value divided by $2^n$, where n=a number of bits of the second resolution.

18. The method of claim 16, wherein the digital output value is determined based on the a number of subtraction operations required to generate a result having a value less than or equal to zero.

19. The method of claim 16, wherein the delay to digital circuit comprises an arithmetic circuit, and wherein the method further comprises, with the arithmetic circuit, successively subtracting the particular value from the third digital value by successively subtracting the particular value from a result of a previous subtraction operation.

20. The method of claim 13, wherein the digital output value corresponds with a ratio of a first time duration to a second time duration, wherein the first time duration starts with a first edge of the counter clock signal and ends with the comparator output signal changing states, and the second time duration is equal to the duration of the period of the counter clock signal.

* * * * *